(12) United States Patent
Zhou et al.

(10) Patent No.: US 11,406,029 B2
(45) Date of Patent: Aug. 2, 2022

(54) CIRCUIT BOARD ASSEMBLY AND RICE COOKER

(71) Applicant: FOSHAN SHUNDE MIDEA ELECTRICAL HEATING APPLIANCES MANUFACTURING CO., LTD., Foshan (CN)

(72) Inventors: Yi Zhou, Foshan (CN); Junfeng Du, Foshan (CN); Peng Chen, Foshan (CN); Jiaying Zhang, Foshan (CN); Xiong Liao, Foshan (CN); Guozhu Li, Foshan (CN); Jingwen Li, Foshan (CN); Fuyou Li, Foshan (CN); Hao Zheng, Foshan (CN)

( * ) Notice: Subject to any disclaimer, the term of this patent is extended or adjusted under 35 U.S.C. 154(b) by 302 days.

(21) Appl. No.: 16/764,881

(22) PCT Filed: Sep. 18, 2018

(86) PCT No.: PCT/CN2018/106291
§ 371 (c)(1),
(2) Date: May 18, 2020

(87) PCT Pub. No.: WO2019/140935
PCT Pub. Date: Jul. 25, 2019

(65) Prior Publication Data
US 2020/0367374 A1   Nov. 19, 2020

(30) Foreign Application Priority Data
Jan. 17, 2018   (CN) .......................... 201810051378.2
Jan. 17, 2018   (CN) .......................... 201820083391.1

(51) Int. Cl.
*H05K 5/02*   (2006.01)
*H05K 5/00*   (2006.01)
(Continued)

(52) U.S. Cl.
CPC ......... *H05K 5/0213* (2013.01); *H05K 5/0013* (2013.01); *H05K 7/20172* (2013.01); *A47J 27/002* (2013.01)

(58) Field of Classification Search
CPC .............. H05K 5/0213; H05K 5/0013; H05K 7/20172; H05K 1/02; A47J 27/002
See application file for complete search history.

(56) References Cited

U.S. PATENT DOCUMENTS 4,585,122 A * 4/1986 Stegenga ............. H05K 9/0067
361/801

FOREIGN PATENT DOCUMENTS

| CN | 201191953 Y | 2/2009 |
| CN | 201602621 U | 10/2010 |

(Continued)

OTHER PUBLICATIONS

International Search Report dated Nov. 29, 2018 in the corresponding International Application No. PCT/CN2018/106291.
The first OA of JP Application No. 2020-532873.

*Primary Examiner* — Abhishek M Rathod
(74) *Attorney, Agent, or Firm* — Kilpatrick Townsend & Stockton, LLP (57) ABSTRACT

Disclosed are a circuit board assembly and a rice cooker, where the circuit board assembly includes: a housing, including a circuit board bracket and a fireproof cover fixing and covering the circuit board bracket, where the fireproof cover and the circuit board bracket are enclosed to define a fireproof cavity; and a circuit board, mounted on the circuit board bracket and accommodated in the fireproof cavity. The present disclosure provides a fireproof cover made of a fireproof material on the circuit board. The fireproof cover and the circuit board bracket may be fixed and covered to define a fireproof cavity, and the circuit board may be accommodated in the fireproof cavity. In this way, the circuit (Continued)

board may be isolated from the outside, to prevent the fire from spreading when the circuit board catches fire, to ensure the safety of users' lives and property.

11 Claims, 4 Drawing Sheets

(51) Int. Cl.
    *H05K 7/20*     (2006.01)
    *A47J 27/00*     (2006.01)

(56) References Cited

FOREIGN PATENT DOCUMENTS

| | | |
|---|---|---|
| CN | 201911909 U | 8/2011 |
| CN | 205429712 U | 8/2016 |
| CN | 206452606 U | 8/2017 |
| CN | 207012085 U | 2/2018 |
| CN | 207252007 U | 4/2018 |
| JP | 2008054718 A | 3/2008 |
| JP | 2010179151 A | 8/2010 |
| JP | 2011143112 A | 7/2011 |
| JP | 2011187780 A | 9/2011 |
| JP | 2013090859 A | 5/2013 |

\* cited by examiner

CIRCUIT BOARD ASSEMBLY AND RICE COOKER

CROSS-REFERENCE TO RELATED APPLICATION

This application is a national stage of International Application No. PCT/CN2018/106291, filed on Sep. 18, 2018, which claims priority to and benefits of Chinese Patent Application Serial No. 201820083391.1 and 201810051378.2, filed with the National Intellectual Property Office Administration of P.R. China on Jan. 17, 2018, the entire content of which is incorporated herein by reference.

FIELD

The present disclosure relates to the field of household appliances, and in particular, to a circuit board assembly and a rice cooker.

BACKGROUND

The coil plate of a rice cooker is connected with a circuit board assembly, which includes a circuit board bracket and a circuit board mounted on the circuit board bracket. The circuit board generates a large amount of heat during operation, and fire may be triggered when the heat is accumulated to a degree. In related technologies, the circuit board assembly is not provided with a fireproof structure, once the circuit board assembly catches fire, the fire will spread to the entire rice cooker, which seriously endangers the lives and property of users.

SUMMARY

Embodiments of the present disclosure are to provide a circuit board assembly, which can prevent the fire from spreading when the circuit board catches fire.

Embodiments of the present disclosure provide a circuit board assembly, applied to a rice cooker, and the circuit board assembly includes:
a housing including:
a circuit board bracket; and
a fireproof cover fixing and covering the circuit board bracket, where the fireproof cover and the circuit board bracket are enclosed to define a fireproof cavity; and
a circuit board mounted on the circuit board bracket and accommodated in the fireproof cavity.

In one embodiment, the circuit board bracket includes:
a back plate; and
a surrounding edge extending from an edge of the back plate, where the surrounding edge and the back plate are enclosed to define a mounting slot adapted to accommodate the circuit board; and
the surrounding edge includes:
an inserting member adapted to be inserted in the fireproof cover; and
an engaging member adapted to be engaged in the fireproof cover.

In one embodiment, the surrounding edge includes:
a supporting plate configured to support the circuit board and including the inserting member; and
two first side plates, where each first side plate extends from one corresponding end of the supporting plate to one side of the supporting plate and including the engaging member.

In one embodiment, the inserting member is an inserting column extending from the supporting plate in a direction away from the back plate;
the engaging members are buckles protruded from two opposite outer wall surfaces of the two first side plates; and
the fireproof cover includes:
an inserting hole corresponding to the inserting column; and
engaging slots corresponding to the buckles.

In one embodiment, the first side plate includes a first wire clamp provided on an outer wall surface of the first side plate; and
the fireproof cover includes:
a face plate facing the back plate; and
two second side plates extending from two sides of the face plate respectively toward the back plate and facing each other; and
a fireproof housing protruded from the second side plate and configured to cover the first wire clamp.

In one embodiment, a second wire clamp is provided on the face plate or an outer surface of at least one of the two second side plates.

In one embodiment, the second wire clamp includes:
a connecting portion, fixedly connected with an outer wall surface of the fireproof cover;
an elastic arm, fixedly connected with the connecting portion; and
a buckle portion, fixedly connect with a free end of the connecting portion.

In one embodiment, the circuit board assembly includes a terminal connector provided on one side of the circuit board; and
the fireproof cover includes:
a fireproof cover body, where the fireproof cover body and the circuit board bracket are enclosed to define a mounting opening corresponding to the terminal connector; and
a terminal protection cover, where the mounting opening is detachably covered by the terminal protection cover.

In one embodiment, the terminal protection cover includes:
a cover plate; and
a plurality of fixing legs, extending from a periphery of the cover plate to one side of the cover plate, where the terminal protection cover is detachably connected with the fireproof cover body through the plurality of fixing legs.

In one embodiment, the fireproof cover body includes an engaging buckle; and
the fixing leg includes an engaging hole adapted to the engaging buckle.

In one embodiment, the fireproof cover body includes a wiring slot, where a terminal of a coil panel of a rice cooker is configured to cross through the wiring slot; and
the wiring slot and the engaging buckle are arranged in a staggered manner.

In one embodiment, an area of the wiring slot is less than or equal to 25 mm$^2$.

In one embodiment, the terminal protection cover includes:
two first fixing legs disposed at intervals on a rear side of the cover plate; and
two second fixing legs disposed at intervals on a front side of the cover plate, where the two first fixing legs and the two second fixing legs are arranged in a staggered manner.

In one embodiment, the circuit board assembly includes:
a mounting groove communicating with the fireproof cavity at a top of the circuit board assembly; and
a cooling fan rotatably mounted in the mounting groove.

In one embodiment, the circuit board bracket is made of a fireproof material.

The present disclosure further provides a rice cooker, which includes a circuit board assembly, and the circuit board assembly includes:

a housing including:

a circuit board bracket; and a fireproof cover fixing and covering the circuit board bracket, where the fireproof cover and the circuit board bracket are enclosed to define a fireproof cavity; and a circuit board mounted on the circuit board bracket and accommodated in the fireproof cavity.

The present disclosure provides a circuit board assembly provided with a housing, and the housing includes a circuit board bracket and a fireproof cover fixing and covering the circuit board bracket. The fireproof cover and the circuit board bracket are enclosed to define a fireproof cavity, and a circuit board of the circuit board assembly is accommodated in the fireproof cavity. In this way, the circuit board may be isolated from the outside, to prevent the fire from spreading when the circuit board catches fire, to ensure the safety of users' lives and property.

BRIEF DESCRIPTION OF THE DRAWINGS

Embodiments of the present disclosure described in the drawings used in the description of the embodiments or the prior art will be briefly introduced below. The drawings in the following description are merely some embodiments of the present disclosure.

DESCRIPTION OF THE REFERENCE NUMERAL

| Reference numeral | Name | Reference numeral | Name |
| --- | --- | --- | --- |
| 100 | Circuit board bracket | 310 | Terminal connector |
| 200 | Fireproof cover | 211 | Fireproof housing |
| 300 | Circuit board | 212 | Second wire clamp |
| 110 | Inserting member | 213 | Engaging buckle |
| 120 | Engaging member | 214 | Wiring slot |
| 130 | First wire clamp | 215 | Curved limit plate |
| 210 | Fireproof cover body | 221 | Cover plate |
| 220 | Terminal protection cover | 222 | Fixing leg |
| 140 | back plate | 150 | surrounding edge |
| 160 | supporting plate | 170 | first side plate |
| 230 | inserting hole | 240 | engaging slot |
| 250 | face plate | 260 | second side plate |
| 2121 | connecting portion | 2122 | elastic arm |
| 2123 | buckle portion | 2131 | engaging hole |
| 180 | mounting groove | 190 | cooling fan |

DETAILED DESCRIPTION OF THE EMBODIMENTS

Embodiments of the present disclosure are described in the following with reference to the drawings in the embodiments of the present disclosure. The described embodiments are only a part of the embodiments of the present disclosure, and not all of them.

It should be noted that all directional indications (such as up, down, left, right, front, back, . . . ) in the embodiments of the present disclosure are only used to explain the relative position relation, motion, etc. of each component under a posture (as shown in the drawing). If the posture changes, the directional indication also changes accordingly.

In addition, the descriptions of "first", "second", and the like in the present disclosure are used for descriptive purposes only, and are not to be construed as indicating or implying their relative importance or implicitly indicating the number of features indicated. Thus, features defining "first" or "second" may include at least one of the features, either explicitly or implicitly.

The present disclosure provides a circuit board assembly, which is provided with a fireproof cover fixing and covering a circuit board bracket. The fireproof cover may prevent the fire from spreading when the circuit board catches fire.

Figure 1:
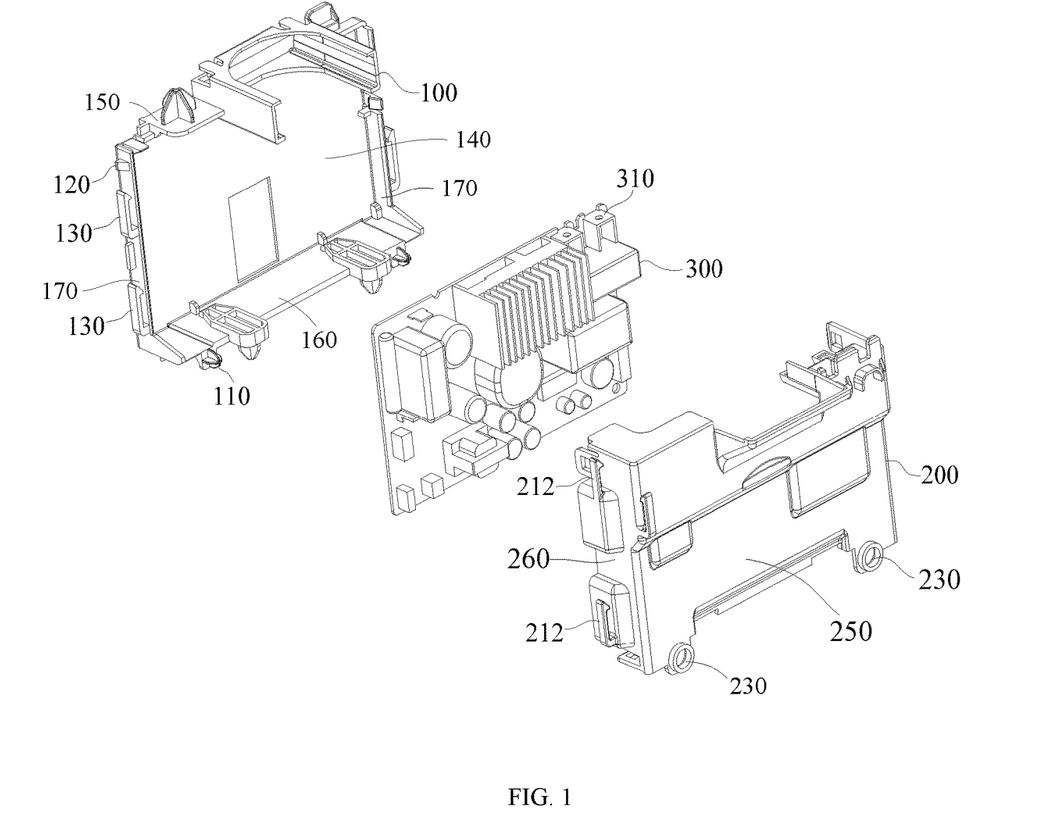
FIG. 1 is a schematic exploded structure view of a circuit board assembly according to an embodiment of the present disclosure.

In an embodiment of the present disclosure, as shown in FIG. 1, the circuit board assembly includes a housing and a circuit board 300. The housing includes a circuit board bracket 100 and a fireproof cover 200 fixing and covering the circuit board bracket 100, and the fireproof cover 200 and the circuit board bracket 100 are enclosed to define a fireproof cavity. The circuit board 300 is mounted on the circuit board bracket 100 and accommodated in the fireproof cavity.

The circuit board 300 may be provided with a plurality of electronic components on the surface, and the electronic components may release a large amount of heat when the circuit board 300 operates. Once the circuit board assembly does not dissipate heat well, a fire may be triggered. In order to prevent the fire from spreading when the circuit board assembly catches fire, the present disclosure provides a fireproof cover 200 made of a fireproof material on the circuit board 300. The fireproof cover 200 and the circuit board bracket 100 may be fixed and covered to define a fireproof cavity, and the circuit board 300 may be accommodated in the fireproof cavity. In this way, the circuit board 300 may be isolated from the outside, to prevent the fire from spreading when the circuit board 300 catches fire, to ensure the safety of users' lives and property.

As an embodiment, the circuit board bracket 100 may also be made of a fireproof material. In this way, the fireproof performance of the circuit board assembly may be further improved. In one embodiment, the fireproof material may be flame-retardant ABS plastic, flame-retardant PP plastic, or galvanized sheet.

In one embodiment, the circuit board assembly may further include a cooling fan 190. A mounting groove 180 communicating with the fireproof cavity may be further defined on a top of the circuit board assembly, and the cooling fan may be rotatably mounted in the mounting groove. In this way, the heat generated by the circuit board 300 may be timely discharged out of the fireproof cavity by the cooling fan, to reduce the possibility of the circuit board 300 catching fire.

Further, a mounting structure of the fireproof cover 200 and the circuit board bracket 100 will be described in detail with reference to FIGS. 1 to 4. The circuit board bracket 100 includes a back plate 140 and a surrounding edge 150 extending from an edge of the back plate. The surrounding edge and the back plate are enclosed to define a mounting slot adapted to accommodate the circuit board 300. The surrounding edge is provided with an inserting member 110 adapted to be inserted in the fireproof cover 200, and an engaging member 120 adapted to be engaged in the fireproof cover 200. Since the inserting member 110 and the engaging member 120 are both detachably mounted, the mounting efficiency of the fireproof cover 200 and the circuit board bracket 100 may be improved.

Further, the surrounding edge includes a supporting plate 160 configured to support the circuit board 300 and two first side plates 170, where each first side plate extends from one end of the supporting plate to one side of the supporting plate. The inserting member 110 adapted to be inserted in the fireproof cover 200 is provided on the supporting plate. The engaging member 120 adapted to be engaged in the fireproof cover 200 is provided on each first side plate. When the fireproof cover 200 is installed with the circuit board bracket 100, a bottom of the fireproof cover 200 may be first inserted and fixed with the inserting member 110 on the supporting plate of the surrounding edge of the circuit board bracket 100. Then an upper part of the fireproof cover 200 may be pushed forward, so that the fireproof cover 200 may be fixedly engaged with the engaging member 120 on the first side plate of the surrounding edge of the circuit board bracket 100. Therefore, the installation process and the removal process of the fireproof cover 200 and the circuit board bracket 100 are very convenient.

In one embodiment, the inserting member 110 is an inserting column extending from the supporting plate in a direction away from the back plate, and an inserting hole 230 is defined on the fireproof cover 200 corresponding to the inserting column. The engaging members 120 are buckles protruded from two opposite outer wall surfaces of the two first side plates. Engaging slots 240 are defined on the fireproof cover 200 corresponding to the buckles.

Further, an outer contour size of the inserting column may be gradually reduced, so that the inserting column may be conveniently inserted into the inserting hole. In this embodiment, the inserting column includes two plates arranged vertically. In other embodiments, the inserting column may also be arranged in a circular truncated cone structure. The buckle includes a guiding surface and an engaging surface, and the engaging slot may be defined by an engaging ring provided on the fireproof cover 200. When the fireproof cover 200 and the circuit board bracket 100 are installed and fixed, the engaging ring may move along the guiding surface of the buckle, until the engaging ring abuts against the engaging surface and the buckle enters the engaging slot of the engaging ring. At this time, the fireproof cover 200 and the circuit board bracket 100 may be fixedly installed.

Figure 2:
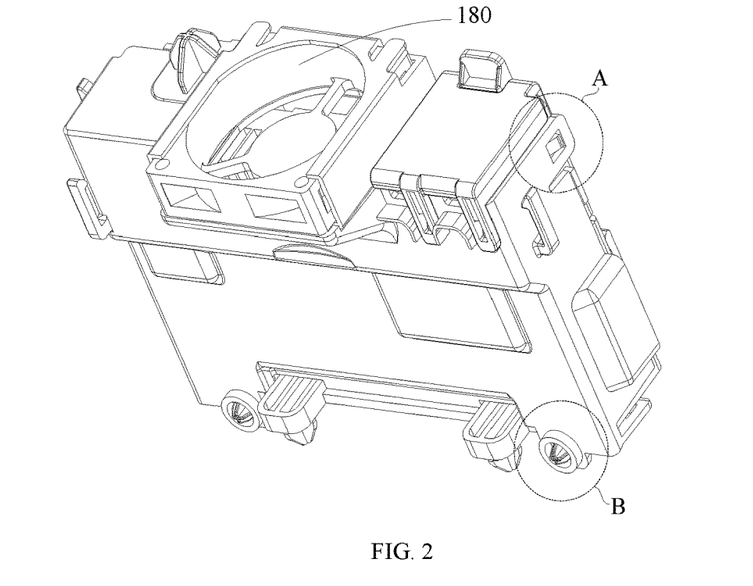
FIG. 2 is a schematic structural view of the circuit board assembly according to an embodiment of the present disclosure.
Figure 3:
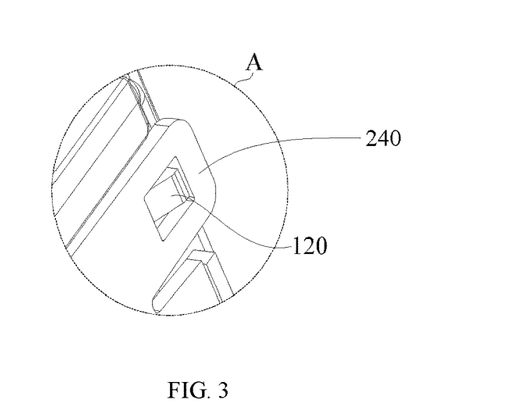
FIG. 3 is an enlarged view of a portion A in FIG. 2.
Figure 4:
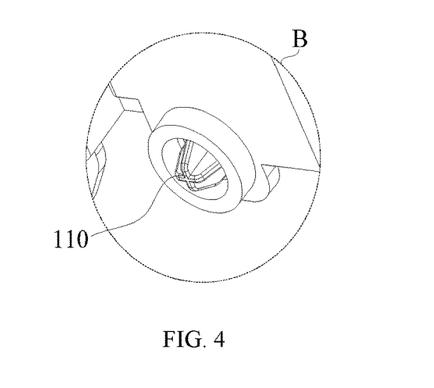
FIG. 4 is an enlarged view of a portion B in FIG. 2.
Figure 5:
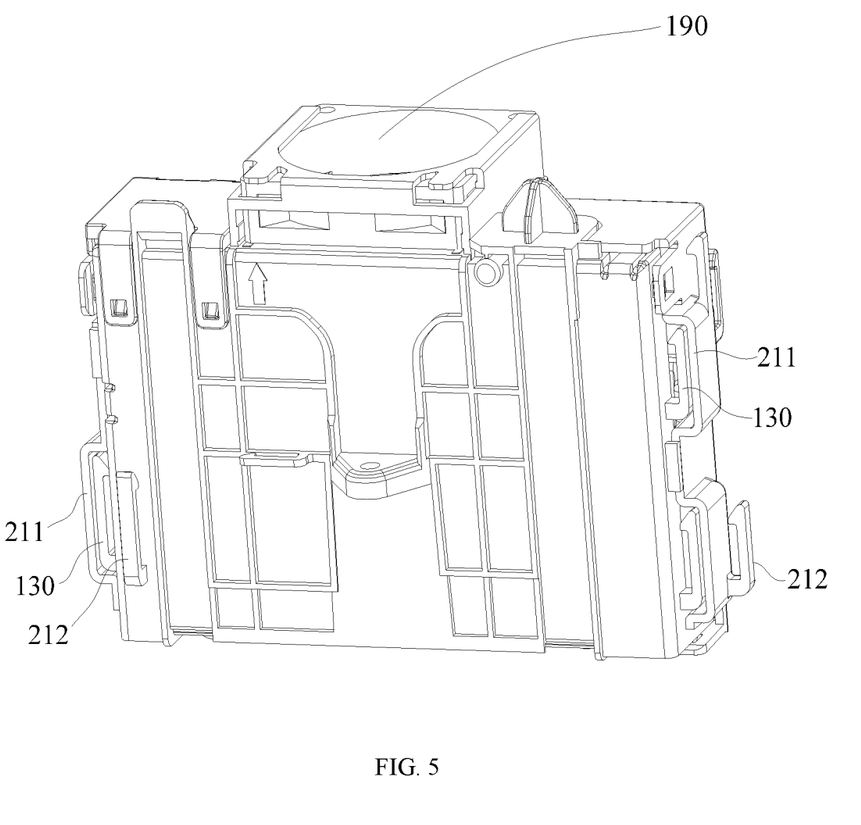
FIG. 5 is another schematic structural view of the circuit board assembly according to an embodiment of the present disclosure.

Further, referring to FIGS. 1, 2 and 5. In order to smoothly lead out the electrical connection wires, a gap may be defined between the circuit board bracket 100 and the fireproof cover 200. In order to prevent flames from escaping from the gap, the fireproof cover 200 may be sleeved on and surround an outer side of the circuit board bracket 100, so that the flame may be prevented from escaping directly from the gap, and the fireproof capability of the housing may be improved.

In order to arrange the electrical connection wires neatly, the present disclosure provides a first wire clamp 130 on the outer wall surface of each first side plate. In this way, the electrical connection wires may be arranged more neatly. Further, a fireproof housing 211 protruded from the fireproof cover 200 may be provided corresponding to each first wire clamp 130 and configured to cover each first wire clamp 130. In one embodiment, the fireproof cover 200 includes a face plate 250 facing the back plate, and two second side plates 260 extending from two sides of the face plate respectively toward the back plate and facing each other. Each second side plate protrudes outward to formed the fireproof housing 211 covering each first wire clamp 130. Since the fireproof housings 211 may be able to cover the first wire clamps 130, the fireproof housing 211 may restrict the flame from escaping from the gap when the electrical connection wires catch fire, to improve the fireproof performance of the fireproof cover 200.

Further, a second wire clamp 212 is further provided on the face plate or an outer surface of at least one of the two second side plates, and the electrical connection wires may pass through the first wire clamp 130 and the second wire clamp 212 in sequence. In this way, the wiring is neat, which may not only reduce the space occupied by the electrical connection wires, but also prevent the electrical connection wires from being entangled with each other, to reduce the risk of fire of the electrical connection wires.

The structures of the first wire clamp 130 and the second wire clamp 212 are basically the same, and the second wire clamp 212 is taken as an example for description. Each second wire clamp 212 includes a connecting portion 2121 fixedly connected with an outer wall surface of the fireproof cover 200; an elastic arm 2122 fixedly connected with the connecting portion; and a buckle portion 2123 fixedly connected with a free end of the elastic arm. A gap is defined between each second wire clamp 212 and the outer wall surface of the fireproof cover 200, and the elastic arm of each second wire clamp 212 has elasticity. In this way, the electrical connection wires may be clamped and fixed between the second wire clamp 212 and the outer wall surface of the fireproof cover 200, so that the problem of disordered wiring of the electrical connection wires may be solved.

Figure 6:
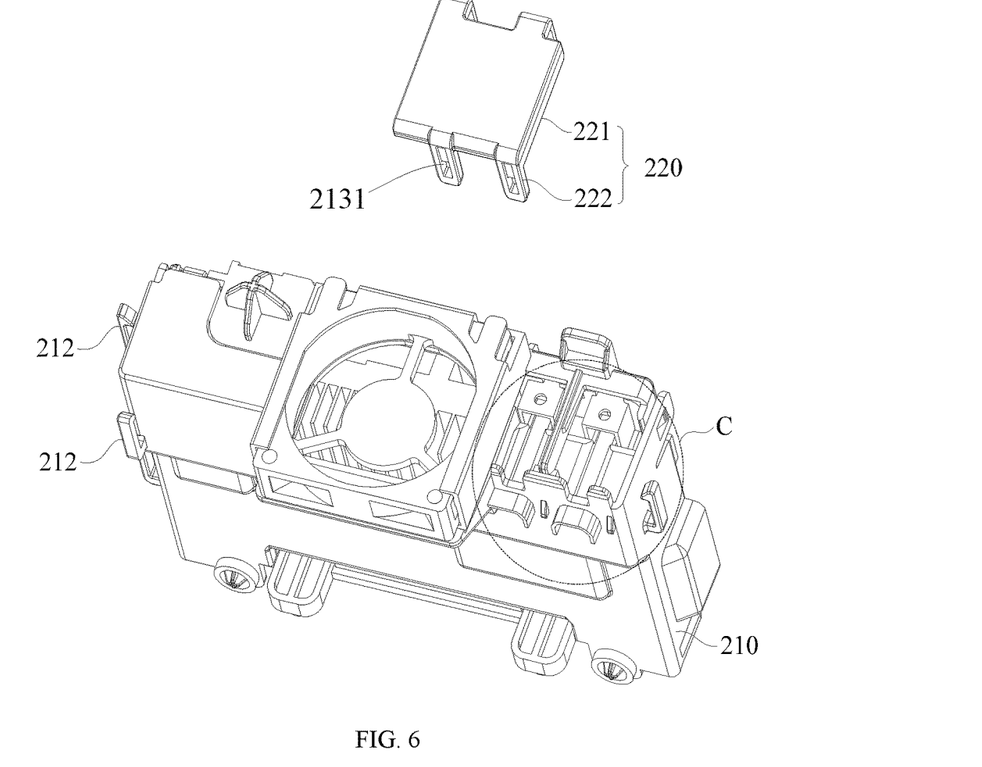
FIG. 6 is a schematic exploded structure view of the circuit board assembly and a coil panel assembly of the present disclosure.
Figure 7:
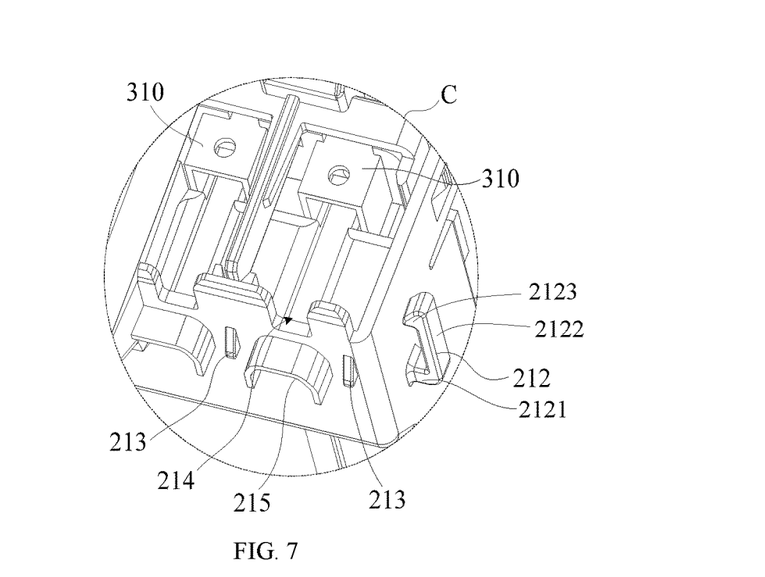
FIG. 7 is an enlarged view of a portion C in FIG. 6.

Further, referring to FIG. 6 and FIG. 7. Considering that the position where the terminal connector 310 of the circuit board assembly is electrically connected with a terminal of a coil panel is likely to trigger a fire due to poor contact, in order to avoid the spread of fire, in an embodiment of the present disclosure, the fireproof cover 200 is further provided with a terminal protection cover 220 configured to cover the terminal connector 310. In one embodiment, one side of the circuit board 300 is provided with a terminal connector 310 configured to be connected with the terminal of the coil panel of the rice cooker. The fireproof cover 200 includes a fireproof cover body 210 and a terminal protection cover 220. The fireproof cover body 210 and the circuit board bracket 100 are enclosed to define a mounting opening corresponding to the terminal connector 310, and the mounting opening is detachably covered by the terminal protection cover 220. The terminal protection cover 220 may be made of a fireproof material. Since the terminal protection cover 220 is fixed and covered to the mounting opening, the terminal protection cover 220 may isolate the terminal connector 310 from the outside, to prevent the fire from spread when the terminal connector 310 catches fire. In addition, since the terminal protection cover 220 is detachably fixed to the mounting opening, the convenience of electrical connection between the terminal of the coil panel and the terminal connector may further be improved, namely, the electrical connection between the terminal of the coil panel and the terminal of the terminal connector may be implemented by screwing after removing the terminal protection cover 220.

Further, the terminal protection cover 220 includes a cover plate 221 and a plurality of fixing legs 222 extending from a periphery of the cover plate 221 to one side of the cover plate 221. The terminal protection cover 220 is detachably connected with the fireproof cover body 210 through the plurality of fixing legs 222. However, the design of the present disclosure is not limited herein. In other embodiments, the periphery of the cover plate 221 may further be provided with engaging buckles, and the fireproof cover body 210 may be correspondingly provided with engaging holes. Thus, the terminal protection cover 220 may be detachably connected with the fireproof cover body 210 through the engaging buckles engaging with the engaging holes.

The structure of the terminal protection cover 220 will be described in detail with reference to FIGS. 6 and 7. The fireproof cover body 210 is provided with an engaging buckle 213 adapted to each fixing leg 222, and each fixing leg 222 is provided with an engaging hole 2131 adapted to the engaging buckle 213. In one embodiment, each fixing leg 222 defines an engaging hole, and the engaging buckle 213 includes a guiding surface and an engaging surface. The bottom of each fixing leg 222 may be moved along the engaging buckle 213 until the engaging buckle 213 enters the engaging hole of each fixing leg 222, to realize the connection between the terminal protection cover 220 and the circuit board assembly. The engaging structure is very convenient for installation and removal, so the installation and removal efficiency of the terminal protection cover 220 may be improved.

As an embodiment, referring to FIG. 7, the fireproof cover body 210 may be further provided with an arc-shaped limit plate 215. When the fixing legs 222 are mounted into the fireproof cover body 210 along the arc-shaped limit plate 215, the engaging hole of each fixing leg 222 may be aligned with the engaging buckle 213 on the fireproof cover body 210. In this way, the installation of the terminal protection cover 220 may be facilitated.

Further, in order to improve the stability of the terminal protection cover 220 and the circuit board assembly after installation, the plurality of fixing legs 222 include two first fixing legs 222 disposed at intervals on a rear side of the cover plate 221; and two second fixing legs 222 disposed at intervals on a front side of the cover plate 221. The two first fixing legs 222 and the two second fixing legs 222 are arranged in a staggered manner. Since the first fixing legs 222 and the second fixing legs 222 are arranged in a staggered manner, the binding force between the engaging buckle 213 and the first fixing legs 222, and the binding force between the engaging buckle 213 and the second fixing legs 222 may be more uniform. In this way, the stability of the terminal protection cover 220 and the circuit board assembly after installation may be improved.

In order to facilitate the electrical connection between the terminal of the coil panel of the rice cooker and the terminal connector 310 on the circuit board 300, the fireproof cover 200 may define a wiring slot 214 through which the terminal of the coil panel may cross through. In one embodiment, wiring slots 214 through which the terminal of the coil panel cross through may be defined on the fireproof cover body 210, and the wiring slots 214 and the engaging buckles 213 are arranged in a staggered manner. In this way, the fixing legs 222 of the terminal protection cover 220 will not block the wiring slots 214, and the terminal of the coil panel may be aligned with the terminal connector through the wiring slots 214. Then the terminal of the coil panel and the terminal connector of the circuit board 300 may be electrically connected through conductive connectors such as screws.

Further, in order to improve the fireproof performance of the fireproof cover 200, the number of wiring slots 214 may be as small as possible, and the area may be as small as possible. As an embodiment, the area of the wiring slot 214 may be less than or equal to 25 mm$^2$. In this way, the electrical connection wires may be drawn out from the wiring slots 214, and the area of the wiring slot 214 won't be too large, so that it may effectively prevent the fire from spreading.

What is claimed is:
1. A circuit board assembly of a rice cooker, comprises a housing and a circuit board;
    wherein the housing comprises a circuit board bracket and a fireproof cover fixing and covering the circuit board bracket, the fireproof cover and the circuit board bracket being enclosed to define a fireproof cavity;
    wherein the circuit board is mounted on the circuit board bracket and accommodated in the fireproof cavity;
    wherein the circuit board comprises a terminal connector provided on one side of the circuit board, and the fireproof cover comprises:
    a fireproof cover body, the fireproof cover body and the circuit board bracket being enclosed to define a mounting opening corresponding to the terminal connector; and
    a terminal protection cover, the mounting opening being detachably covered by the terminal protection cover;
    wherein the terminal protection cover comprises:
    a cover plate; and
    a plurality of fixing legs, extending from a periphery of the cover plate to a first side of the cover plate, the terminal protection cover being detachably connected with the fireproof cover body through the plurality of fixing legs;
    wherein the fireproof cover body comprises a plurality of engaging buckles, and each of the plurality of fixing legs comprises an engaging hole adapted to one of the plurality of engaging buckles;
    wherein the fireproof cover body comprises a wiring slot, a terminal of a coil panel of a rice cooker being configured to cross through the wiring slot, and the wiring slot and the engaging buckle are arranged in a staggered manner;
    wherein an area of the wiring slot is less than or equal to 25 mm$^2$.
2. The circuit board assembly according to claim 1, wherein:
    the circuit board bracket comprises:
    a back plate; and
    a surrounding edge extending from an edge of the back plate, the surrounding edge and the back plate being enclosed to define a mounting slot adapted to accommodate the circuit board; and
    the surrounding edge comprises:
    an inserting member adapted to be inserted in the fireproof cover; and
    an engaging member adapted to be engaged in the fireproof cover.
3. The circuit board assembly according to claim 2, wherein the surrounding edge comprises:

a supporting plate configured to support the circuit board and comprising the inserting member; and two first side plates, each first side plate extending from one corresponding end of the supporting plate to one side of the supporting plate and comprising the engaging member.

4. The circuit board assembly according to claim 3, wherein:

the inserting member is an inserting column extending from the supporting plate in a direction away from the back plate;

engaging members are buckles protruded from two opposite outer wall surfaces of the two first side plates; and the fireproof cover comprises:

an inserting hole corresponding to the inserting column; and engaging slots corresponding to the buckles.

5. The circuit board assembly according to claim 3, wherein:

a first side plate comprises a first wire clamp provided on an outer wall surface of the first side plate; and the fireproof cover comprises:

a face plate facing the back plate; and two second side plates extending from a first and second side of the face plate respectively toward the back plate and facing each other; and a fireproof housing protruded from one of the second side plates and configured to cover the first wire clamp.

6. The circuit board assembly according to claim 5, wherein a second wire clamp is provided on an outer surface of the face plate or an outer surface of at least one of the two second side plates.

7. The circuit board assembly according to claim 6, wherein the second wire clamp comprises:

a connecting portion, fixedly connected with an outer wall surface of the fireproof cover;

an elastic arm, fixedly connected with the connecting portion; and a buckle portion, fixedly connected with a free end of the elastic arm.

8. The circuit board assembly according to claim 1, wherein the terminal protection cover comprises:

two first fixing legs disposed at intervals on a rear side of the cover plate; and two second fixing legs disposed at intervals on a front side of the cover plate, the two first fixing legs and the two second fixing legs being arranged in a staggered manner.

9. The circuit board assembly according to claim 1, wherein the circuit board assembly comprises:

a mounting groove communicating with the fireproof cavity at a top of the circuit board assembly; and a cooling fan rotatably mounted in the mounting groove.

10. The circuit board assembly according to claim 1, wherein the circuit board bracket is made of a fireproof material.

11. A rice cooker, comprising a circuit board assembly, wherein the circuit board assembly comprises a housing and a circuit board;

wherein the housing comprises:

a circuit board bracket; and a fireproof cover fixing and covering the circuit board bracket, the fireproof cover and the circuit board bracket being enclosed to define a fireproof cavity;

wherein the circuit board is mounted on the circuit board bracket and accommodated in the fireproof cavity;

wherein the circuit board comprises a terminal connector provided on one side of the circuit board, and the fireproof cover comprises:

a fireproof cover body, the fireproof cover body and the circuit board bracket being enclosed to define a mounting opening corresponding to the terminal connector; and a terminal protection cover, the mounting opening being detachably covered by the terminal protection cover;

wherein the terminal protection cover comprises:

a cover plate; and a plurality of fixing legs, extending from a periphery of the cover plate to a first side of the cover plate, the terminal protection cover being detachably connected with the fireproof cover body through the plurality of fixing legs;

wherein the fireproof cover body comprises a plurality of engaging buckles, and each of the plurality of fixing legs comprises an engaging hole adapted to one of the plurality of engaging buckles;

wherein the fireproof cover body comprises a wiring slot, a terminal of a coil panel of a rice cooker being configured to cross through the wiring slot, and the wiring slot and the engaging buckle are arranged in a staggered manner;

wherein an area of the wiring slot is less than or equal to 25 mm$^2$.

* * * * *